(12) United States Patent
Shimada et al.

(10) Patent No.: US 8,110,463 B2
(45) Date of Patent: Feb. 7, 2012

(54) METHOD OF FABRICATING SEMICONDUCTOR DEVICE

(75) Inventors: Satoru Shimada, Hashima (JP);
Yasuhiro Takeda, Ogaki (JP); Seiji Otake, Kumagaya (JP)

(73) Assignees: Sanyo Electric Co., Ltd., Osaka (JP);
Sanyo Semiconductor Co., Ltd., Gunma (JP)

( * ) Notice: Subject to any disclaimer, the term of this patent is extended or adjusted under 35 U.S.C. 154(b) by 36 days.

(21) Appl. No.: 12/363,553

(22) Filed: Jan. 30, 2009

(65) Prior Publication Data
US 2009/0197378 A1 Aug. 6, 2009

(30) Foreign Application Priority Data
Feb. 1, 2008 (JP) ................................. 2008-022366

(51) Int. Cl.
*H01L 21/8249* (2006.01)
(52) U.S. Cl. ................. 438/234; 257/E21.696
(58) Field of Classification Search .................. 438/234; 257/E21.409, E21.696
See application file for complete search history.

(56) References Cited

U.S. PATENT DOCUMENTS

| 5,196,356 A * | 3/1993 | Won et al. | 438/203 |
| 5,525,529 A * | 6/1996 | Guldi | 438/565 |
| 6,180,442 B1 * | 1/2001 | Gris | 438/202 |
| 6,420,273 B1 * | 7/2002 | Lin | 438/706 |
| 6,582,998 B2 * | 6/2003 | Nitta | 438/217 |
| 7,402,480 B2 * | 7/2008 | Hebert et al. | 438/201 |
| 2002/0055220 A1 * | 5/2002 | Soderbarg et al. | 438/234 |
| 2005/0230762 A1 * | 10/2005 | Ookubo et al. | 257/370 |
| 2007/0090485 A1 * | 4/2007 | Takao | 257/510 |

FOREIGN PATENT DOCUMENTS

| JP | 05-006961 A | 1/1993 |
| JP | 07-297305 A | 11/1995 |
| JP | 3971442 B2 | 9/2007 |

* cited by examiner

*Primary Examiner* — Khiem D Nguyen
*Assistant Examiner* — Christine Enad
(74) *Attorney, Agent, or Firm* — Ditthavong Mori & Steiner, P.C.

(57) ABSTRACT

A method of fabricating a semiconductor device includes a first step of forming a defect suppression film suppressing increase in a defect due to implantation of an impurity on a semiconductor substrate, a second step of forming an active region on a surface of the semiconductor substrate by implanting the impurity through the defect suppression film, a third step of removing the defect suppression film and a fourth step of forming an interface state suppression film suppressing increase in an interface state density of the active region on the active region.

13 Claims, 4 Drawing Sheets

METHOD OF FABRICATING SEMICONDUCTOR DEVICE

CROSS-REFERENCE TO RELATED APPLICATIONS

The priority application number JP2008-22366, Method of Fabricating Semiconductor Device, Feb. 1, 2008, Satoru Shimada, Yasuhiro Takeda, Seiji Otake, upon which this patent application is based is hereby incorporated by reference.

BACKGROUND OF THE INVENTION

1. Field of the Invention

The present invention relates to a method of fabricating a semiconductor device.

2. Description of the Background Art

A method of fabricating a semiconductor device is known in general.

Japanese Patent Laying-Open No. 5-6961 discloses a method of fabricating a semiconductor device (BiCMOS transistor) formed with a bipolar transistor and a field-effect transistor on the same substrate. In this conventional method of fabricating a semiconductor device (BiCMOS transistor), a step of fabricating the bipolar transistor includes a step of forming an oxide film on a surface of a base region after forming the base region. Then a step of forming a nitride film on a surface of the oxide film is performed. In this conventional method of fabricating a semiconductor device (BiCMOS transistor), when performing a step of forming a source and a drain of the field-effect transistor, the oxide film is employed as a protective film for performing ion implantation.

SUMMARY OF THE INVENTION

A method of fabricating a semiconductor device according to a first aspect of the present invention comprises a first step of forming a defect suppression film suppressing increase in a defect due to implantation of an impurity on a semiconductor substrate, a second step of forming an active region on a surface of the semiconductor substrate by implanting the impurity through the defect suppression film, a third step of removing the defect suppression film and a fourth step of forming an interface state suppression film suppressing increase in an interface state density of the active region on the active region, wherein the defect suppression film is capable of suppressing increase in the defect as compared with the interface state suppression film, and the interface state suppression film is capable of suppressing increase in the interface state density as compared with the defect suppression film.

A method of fabricating a semiconductor device according to a second aspect of the present invention comprises a first step of forming a defect suppression film made of a silicon nitride film suppressing increase in a defect due to implantation of an impurity on a silicon substrate, a second step of forming an active region on a surface of the silicon substrate by implanting the impurity through the defect suppression film, a third step of removing the defect suppression film and a fourth step of forming an interface state suppression film made of a silicon oxide film suppressing increase in an interface state density of the active region on the active region.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention will be hereinafter described with reference to drawings.

A structure of a semiconductor device 100 according to an embodiment of the present invention will be now described with reference to FIG. 1. The semiconductor device 100 according to this embodiment is constituted as a BiCMOS transistor formed with a field-effect transistor and a bipolar transistor on the same substrate.

Figure 1:
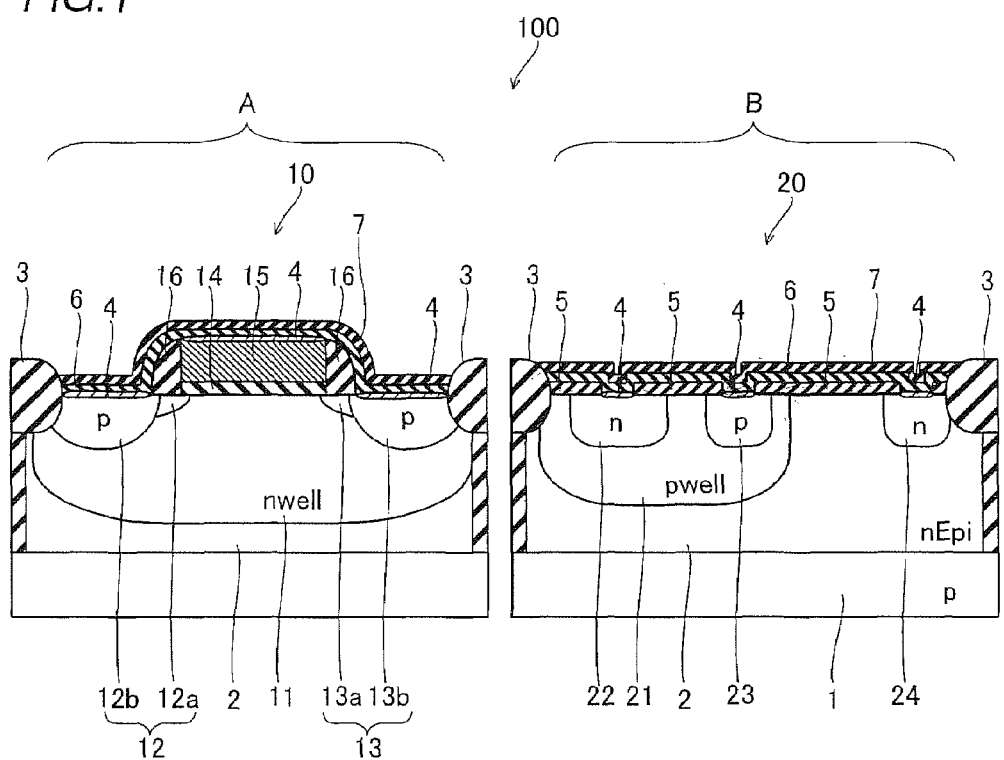
FIG. 1 is a sectional view showing a structure of a semiconductor device according to an embodiment of the present invention.

In the semiconductor device 100 according to the embodiment of the present invention, an n-type epitaxial layer 2 is formed on a surface of the p-type silicon substrate 1 as shown in FIG. 1. A surface of the epitaxial layer 2 is constituted by a region A formed with a field-effect transistor 10 and a region B formed with a bipolar transistor 20. An isolation region 3 for isolating the region A and the region B from each other is formed between the region A and the region B. Thus, the semiconductor device 100 is constituted as the BiCMOS transistor formed with the field-effect transistor 10 and the npn bipolar transistor 20 on the same semiconductor substrate (the silicon substrate 1 and the epitaxial layer 2 in this embodiment). The silicon substrate 1 and the epitaxial layer 2 are examples of the "semiconductor substrate" in the present invention. The field-effect transistor 10 and the bipolar transistor 20 are examples of the "field-effect transistor" and the "junction transistor" in the present invention respectively.

As a structure of the field-effect transistor 10, an n-well layer 11 is formed on the surface of the epitaxial layer 2 in the region A. A p-type source region 12 and a p-type drain region 13 are formed on a surface of the n-well layer 11 at a prescribed interval therebetween. The source region 12, the drain region 13 and the n-well layer 11 are examples of the "active region" in the present invention. The source region 12 and the drain region 13 have LDD (lightly doped drain) structures respectively. More specifically, the source region 12 includes a high concentration $p^+$-type source region 12a and a low concentration p-type source region 12b. Similarly, the drain region 13 also includes a high concentration $p^+$-type drain region 13a and a low concentration p-type drain region 13b. A gate insulating film 14 is formed on a position held between the source region 12 and the drain region 13 on the surface of the n-well layer 11. A gate electrode 15 is formed on a surface of the gate insulating film 14. A sidewall 16 is formed on side surfaces of the gate insulating film 14 and the gate electrode 15.

As a structure of the npn bipolar transistor 20, a p-well layer 21 is formed on the surface of the epitaxial layer 2 in the region B. The n-type emitter layer 22 and the p-type base layer 23 are formed on a surface of the p-well layer 21. An n-type collector layer 24 is formed on the surface of the epitaxial layer 2 at a prescribed interval from the p-well layer 21. The emitter layer 22, the base layer 23 and the collector layer 24 are examples of the "active region" in the present invention respectively.

According to this embodiment, silicide films 4 are formed on surfaces of the source region 12b, the drain region 13b and the gate electrode 15 of the field-effect transistor 10 and prescribed regions of surfaces of the emitter layer 22, the base layer 23 and the collector layer 24 of the bipolar transistor 20 respectively. Each of the silicide films 4 has a function for serving as an electrode portion. The silicide film 4 is an example of the "metal compound film" in the present invention.

According to this embodiment, a first oxide film 5 made of $SiO_2$ is so formed on a surface of the bipolar transistor 20 as to cover a region other than regions where the silicide films 4 are formed. A second oxide film 6 made of $SiO_2$ is formed to cover surfaces of the silicide films 4 and the first oxide film 5 of the bipolar transistor 20. Additionally, the second oxide film 6 is formed to cover also a surface of the field-effect transistor 10. A nitride film 7 made of SiN is formed to cover the surface of the second oxide film 6 formed in the regions A and B. The first oxide film 5, the second oxide film 6 and the nitride film 7 are examples of the "interface state suppression film", the "stress relaxation film" and the "moisture barrier film" in the present invention respectively.

A fabrication process for the semiconductor device 100 according to the embodiment of the present invention will be now described with reference to FIGS. 1 to 7.

Figure 2:
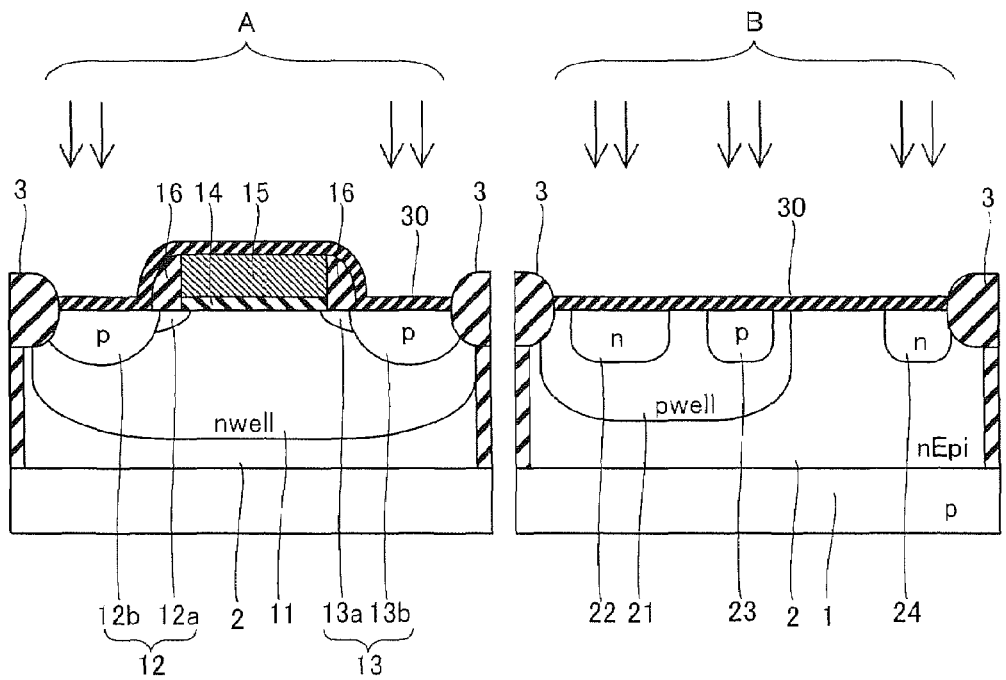
FIGS. 2 to 7 are sectional views for illustrating a fabricating process for the semiconductor device according to the embodiment of the present invention.

As shown in FIG. 2, the n-type epitaxial layer 2 is formed on the surface of the p-type silicon substrate 1 by epitaxial growth. Then the isolation region 3 is formed on a prescribed region of the epitaxial layer 2 by a p-type isolation layer and LOCOS (local oxidation of silicon) or STI (shallow trench isolation). Then $SiO_2$ film is formed on the surface of the epitaxial layer 2 by thermal oxidation. An n-type impurity is implanted into the epitaxial layer 2 in the region A thereby forming the n-well layer 11. Then a polysilicon film is formed by CVD. The gate electrode 15 and the gate insulating film 14 are thereafter formed by photolithography and etching. Then $SiO_2$ film is formed by CVD and the sidewall 16 is formed on the side surfaces of the gate electrode 15 and the gate insulating film 14 by etching. A p-type impurity is implanted into the epitaxial layer 2 in the region B, as shown by the arrows in FIG. 2, thereby forming the p-well layer 21. Then nitride film 30 made of SiN is formed in the regions A and B by CVD. The nitride film 30 is an example of the "defect suppression film" in the present invention. In the region A, RTA (rapid thermal anneal) is performed after implanting the p-type impurity, thereby forming the p+-type source region 12a, the p-type source region 12b, the p+-type drain region 13a and the p-type drain region 13b. In the region B, RTA is performed after implanting the n-type impurity and the p-type impurity into prescribed regions of the p-well layer 21 respectively, thereby forming the emitter layer 22 and the base layer 23. Similarly, RTA is performed after implanting an n-type impurity into the epitaxial layer 2, thereby forming the collector layer 24. The nitride film 30 functions as a defect suppression film for suppressing increase of defects of a substrate surface in ion implantation. More specifically, in this case, the defect means increase of a resistance due to implantation of other impurity in ion implantation. If an oxide film is employed as in a conventional case, oxygen contained in the oxide film is implanted into the substrate and a resistance is increased. Implantation of other impurity into the substrate can be suppressed by employing the nitride film as in this application.

Figure 3:
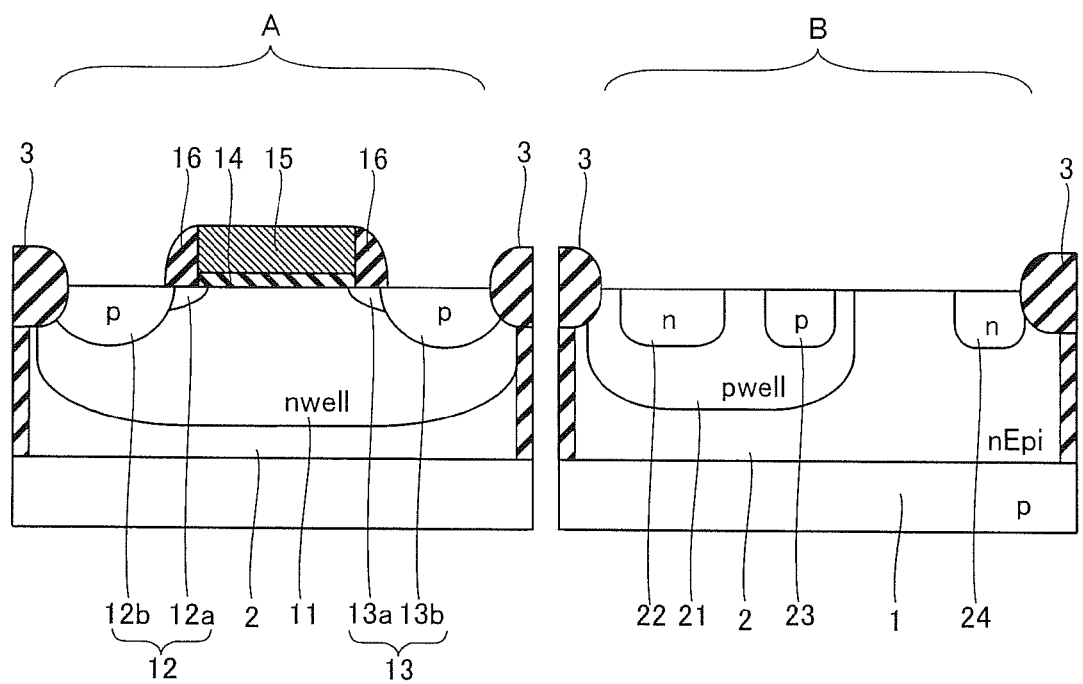
Figure 4:
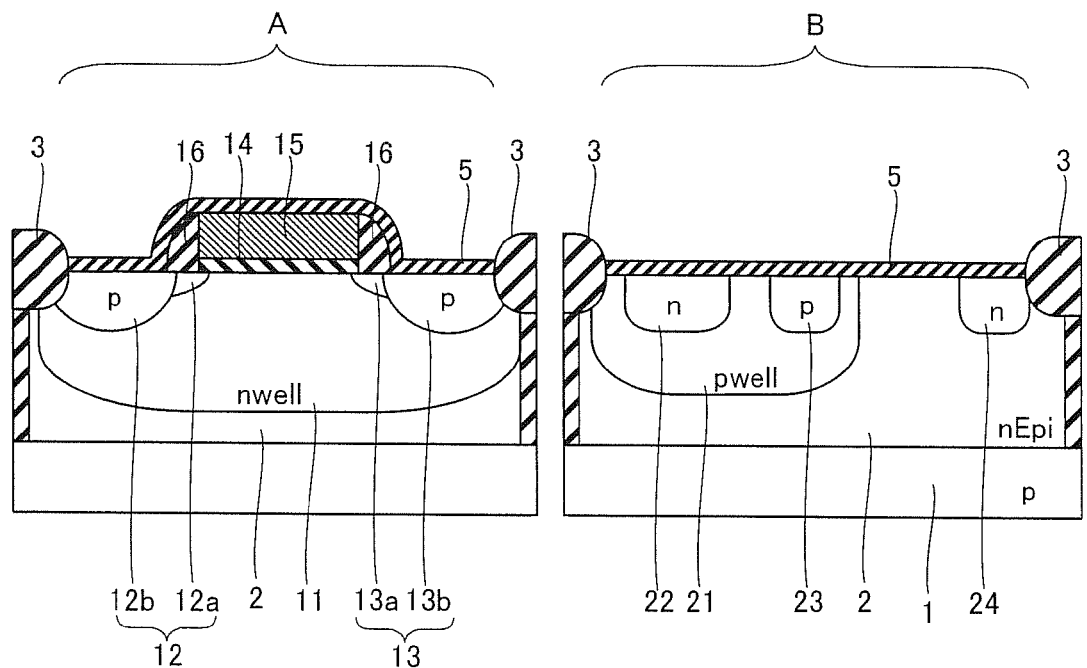

The nitride film 30 (see FIG. 2) is removed by wet etching shown in FIG. 3, and the first oxide film 5 made of $SiO_2$ is deposited by CVD as shown in FIG. 4. Then annealing is performed under an oxygen atmosphere for recovering an interface state of the bipolar transistor 20 to the first oxide film 5.

Figure 5:
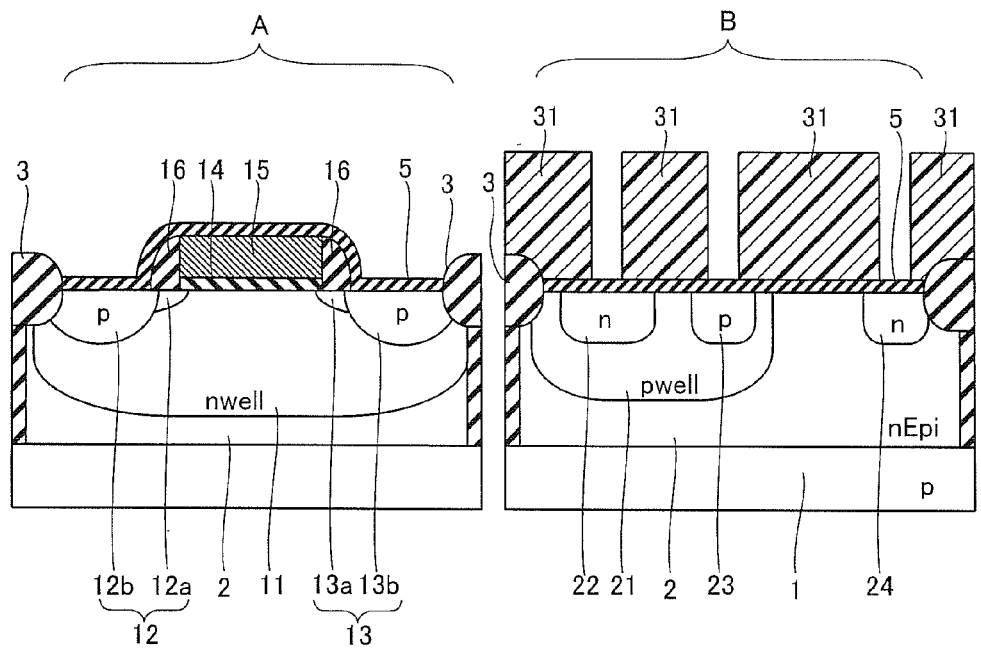
Figure 6:
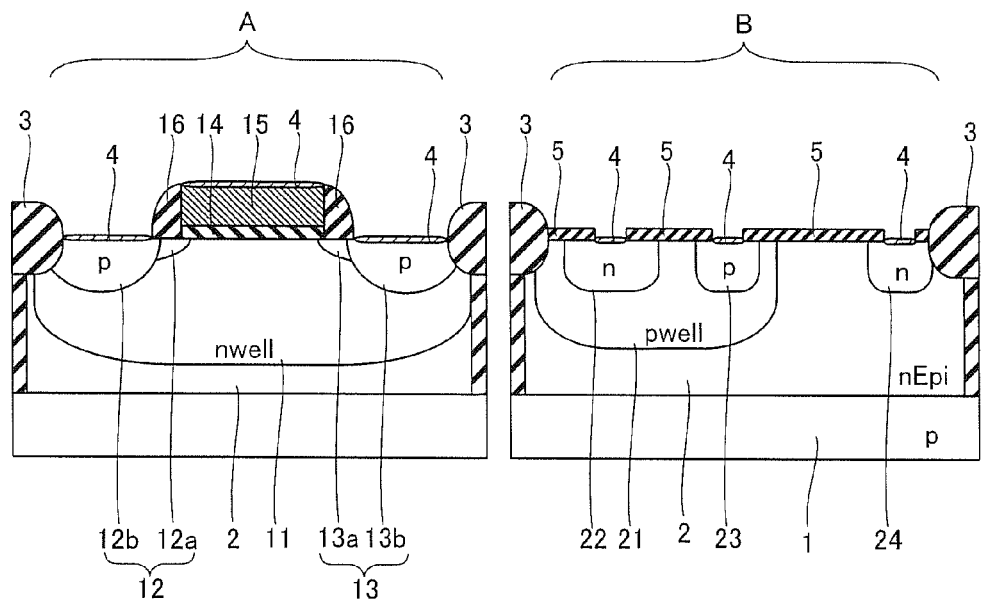
Figure 7:
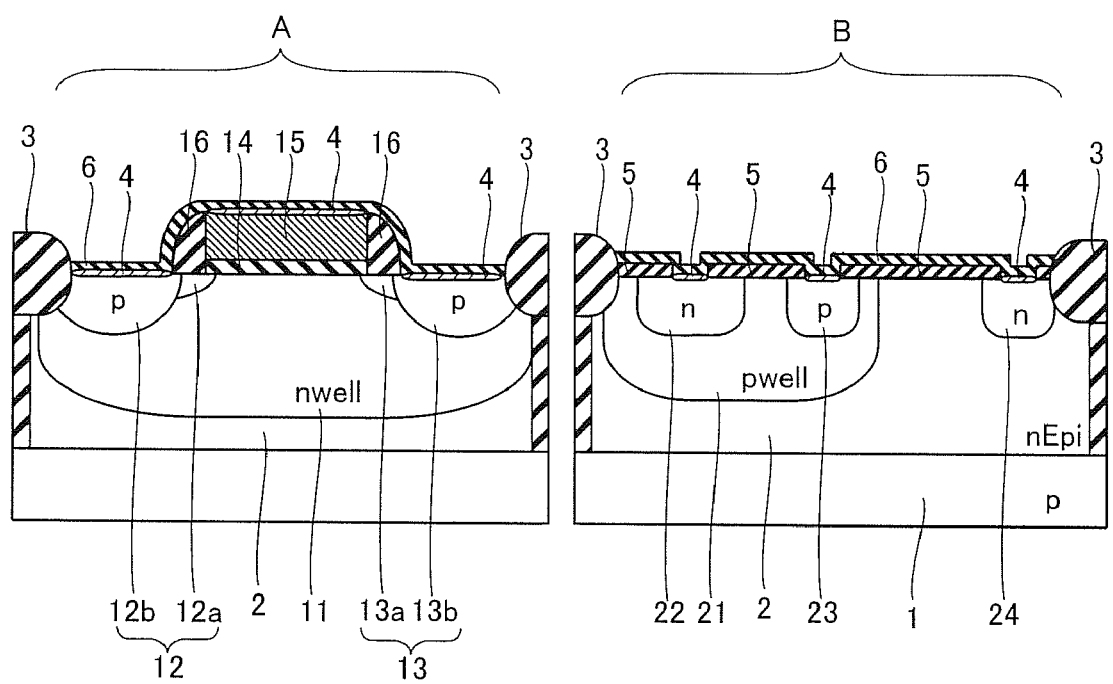

As shown in FIG. 5, a resist film 31 is formed on a prescribed region of the region B and the first oxide film 5 is thereafter open by etching. Then the open first oxide film 5 is employed as a block mask for performing a salicide step. Thus, the silicide films 4 are formed on the surfaces of the source region 12b and the drain region 13b in the region A as shown in FIG. 6. Similarly, the silicide films 4 are formed on the prescribed regions of the surfaces of the emitter layer 22, the base layer 23 and the collector layer 24 also in the region B. Then the second oxide film 6 made of $SiO_2$ is formed by CVD as shown in FIG. 7. Thereafter the nitride film 7 made of SiN is formed by CVD as shown in FIG. 1. Then plugs (not shown) are formed on the respective silicide films 4 formed on the source region 12b, the drain region 13b, the gate electrode 15, the emitter layer 22, the base layer 23 and the collector layer 24 through contact holes (not shown), thereby forming the semiconductor device 100. A (second) moisture barrier film may be further provided on an upper layer of a layer where the plugs are formed. Thus, the second oxide film 6 is formed to be in contact with the surface of the field-effect transistor 10 and the nitride film 7 is formed on the surface of the second oxide film 6 in the region A. In the region B, the first oxide film 5 is formed to be in contact with the surface of the bipolar transistor 20 and the second oxide film 6 is formed on the surface of the first oxide film 5. In other words, the oxide film has a two-layer structure in the region B. Then the nitride film 7 is formed on the surface of the second oxide film 6 in the region A and the region B.

According to this embodiment, the first oxide film 5 made of $SiO_2$ is formed between the bipolar transistor 20 and the nitride film 7 made of SiN. Thus, a density (interface state density) of defects caused on the surface of the bipolar transistor 20 (in particular, regions where the emitter layer 22, the base layer 23 and the collector layer 24 are formed) can be reduced as compared with a case where the nitride film 7 is directly formed on the surface of the bipolar transistor 20. Thus, reduction in high speed response (high frequency characteristic) of the bipolar transistor 20 can be suppressed.

According to this embodiment, the first oxide film 5 is formed on the substrate surface, whereby increase in an interface state density of the bipolar transistor 20 can be suppressed and the first oxide film 5 can be employed as a block film in the salicide step. Thus, increase in the number of steps can be suppressed.

According to this embodiment, when the first oxide film 5 is partially open for forming the silicide films 4 in the region B, the first oxide film 5 formed on the surface of the field-effect transistor 10 in the region A is simultaneously removed. On the other hand, the second oxide film 6 formed so as to cover the silicide films 4 provided on open portions in the region B is formed also on the surface of the field-effect transistor 10 in the region A. Thus, the nitride film 7 is formed on the second oxide film 6, and hence direct contact between the surface of the field-effect transistor 10 and the nitride film 7 can be suppressed. Consequently, the density of defects caused on the surface of the field-effect transistor 10 can be reduced and hence reduction in high speed response (high frequency characteristic) of the field-effect transistor 10 can be suppressed. A water absorbing property of the field-effect transistor 10 can be suppressed by the nitride film 7 while suppressing reduction in the high speed response.

According to this embodiment, the second oxide film 6 formed so as to cover the silicide films 4 in the region B can be employed as the protective film of the field-effect transistor 10 to the nitride film 7 in the region A and hence fabricating steps can be simplified.

The second oxide film 6 is so formed as to cover also the surfaces of the silicide films 4 on the emitter layer 22, the base layer 23 and the collector layer 24 of the bipolar transistor 20. Thus, stress caused in the silicide films 4 is relaxed as compared with a case where the nitride film is directly formed on the silicide films 4 formed on the emitter layer 22, the base layer 23 and the collector layer 24. This is because stress of the oxide film to the silicide film is smaller than stress of the nitride film to the silicide film.

Although the present invention has been described and illustrated in detail, it is clearly understood that the same is by way of illustration and example only and is not to be taken by way of limitation, the spirit and scope of the present invention being limited only by the terms of the appended claims.

For example, while the aforementioned embodiment is applied to the BiCMOS transistor as an exemplary semiconductor device including a bipolar transistor, the present invention is not restricted to this but also applicable to a simple bipolar transistor.

While the oxide film formed on the surface of the semiconductor device has the two-layer structure of the first oxide film and the second oxide film in the aforementioned embodiment, the present invention is not restricted to this but the oxide film may has a single-layer structure of only single first oxide film. In this case, in the aforementioned fabrication process for the semiconductor device, the nitride film 7 is formed by CVD after performing the salicide step for forming the silicide films 4. Thus, the first oxide film is formed to be in contact with the surface of the bipolar transistor formed in the region B and the nitride film is formed on the surface of the first oxide film.

While the n-type epitaxial layer is formed on the p-type silicon substrate in the aforementioned embodiment, the present invention is not restricted to this but the p-type epitaxial layer is formed on the n-type silicon substrate.

While the aforementioned embodiment of the present invention is applied to the BiCMOS transistor including the bipolar transistor and the field-effect transistor (CMOS transistor), the present invention is not restricted to this but is also applicable to an npn bipolar transistor and a pnp bipolar transistor. The field-effect transistor of the present invention is applicable to an NMOS transistor and a PMOS transistor.

What is claimed is:

1. A method of fabricating a semiconductor device comprising:
    a first step of forming a defect suppression film suppressing increase in a defect due to implantation of an impurity on a semiconductor substrate so as to cover a surface of a gate electrode of a field-effect transistor and a surface of said semiconductor substrate where a junction transistor and said field-effect transistor are formed;
    a second step of forming an active region on a surface of said semiconductor substrate by implanting said impurity through said defect suppression film;
    a third step of removing said defect suppression film; and
    a fourth step of forming an interface state suppression film suppressing increase in an interface state density of said active region on said active region, wherein
    said defect suppression film is capable of suppressing increase in said defect as compared with said interface state suppression film,
    said interface state suppression film is capable of suppressing increase in said interface state density as compared with said defect suppression film,
    said second step includes:
    a step of implanting an impurity for forming a source region and a drain region of said field-effect transistor; and
    a step of implanting an impurity for forming any of an emitter region, a collector region, and a base region of said junction transistor, and
    said fourth step includes a step of forming said interface state suppression film by depositing an oxide film on said semiconductor substrate on which a gate electrode of said field-effect transistor has been formed, so as to be directly in contact with the surface of said gate electrode, said source region, and said drain region of said field-effect transistor, and, said emitter region, said collector region, and said base region of said junction transistor, respectively, and then annealing said oxide film under an oxygen atmosphere.

2. The method of fabricating a semiconductor device according to claim 1, further comprising:
    a fifth step of removing a part of said interface state suppression film on said active region to form an opening;
    a sixth step of forming a metal compound film by metalizing said surface of said semiconductor substrate of said active region which is open;
    a seventh step of forming a stress relaxation film on said metal compound film; and
    an eighth step of forming a moisture barrier film on said interface state suppression film.

3. The method of fabricating a semiconductor device according to claim 2, wherein
    said stress relaxation film is formed in contact with said interface state suppression film and said moisture barrier film.

4. The method of fabricating a semiconductor device according to claim 2, wherein
    said semiconductor substrate is formed with a junction transistor and a field-effect transistor, and
    said fifth step includes a step of removing a part of the interface state suppression film on a surface of said field-effect transistor and on the active region of said junction transistor to form an opening.

5. The method of fabricating a semiconductor device according to claim 1, wherein
    said first step includes a step of forming said defect suppression film by depositing a silicon nitride film on said semiconductor substrate.

6. The method of fabricating a semiconductor device according to claim 1, wherein
    said third step includes a step of removing said defect suppression film formed on said semiconductor substrate by wet etching.

7. The method of fabricating a semiconductor device according to claim 2, wherein
    said seventh step includes a step of forming said stress relaxation film by depositing a silicon oxide film on a surface of said metal compound film and a surface of said interface state suppression film.

8. The method of fabricating a semiconductor device according to claim 2, wherein
    said eighth step includes a step of forming said moisture barrier film by depositing a silicon nitride film on a surface of said stress relaxation film.

9. A method of fabricating a semiconductor device comprising:
    a first step of forming a defect suppression film made of a silicon nitride film suppressing increase in a defect due to implantation of an impurity on a silicon substrate so as to cover a surface of a gate electrode of a field effect transistor and a surface of said silicon substrate where a junction transistor and said field-effect transistor are formed;
    a second step of forming an active region on a surface of said silicon substrate by implanting said impurity through said defect suppression film;

a third step of removing said defect suppression film; and a fourth step of forming an interface state suppression film made of a silicon oxide film suppressing increase in an interface state density of said active region on said active region, wherein, said fourth step includes a step of forming said interface state suppression film by depositing an oxide film on said silicon substrate on which a gate electrode of said field-effect transistor has been formed, so as to be directly in contact with the surface of said gate electrode, said source region, and said drain region of said field-effect transistor, and said emitter region, said collector region, and said base region of said junction transistor, respectively, and then annealing said oxide film under an oxygen atmosphere, and wherein said second step includes:

a step of implanting an impurity for forming a source region and a drain region of said field-effect transistor; and a step of implanting an impurity for forming any of an emitter region, a collector region and a base region of said junction transistor.

10. The method of fabricating a semiconductor device according to claim 9, further comprising:

a fifth step of removing a part of said interface state suppression film on said active region to form an opening;

a sixth step of forming a metal silicide film by siliciding a surface of said silicon substrate of said active region which is open, a seventh step of forming a stress relaxation film made of a silicon oxide film on said metal silicide film; and an eighth step of forming a moisture barrier film made of a silicon nitride film on said interface state suppression film.

11. The method of fabricating a semiconductor device according to claim 10, wherein said stress relaxation film is formed in contact with said interface state suppression film and said moisture barrier film.

12. The method of fabricating a semiconductor device according to claim 10, wherein said silicon substrate is formed with a junction transistor and a field-effect transistor, and said fifth step includes a step of removing a part of the interface state suppression film on a surface of said field-effect transistor and on the active region of said junction transistor to form an opening.

13. The method of fabricating a semiconductor device according to claim 9, wherein said third step includes a step of removing said defect suppression film formed on said silicon substrate by wet etching.

* * * * *